United States Patent
Rocklein et al.

(10) Patent No.: US 10,586,923 B2
(45) Date of Patent: Mar. 10, 2020

(54) RESISTIVE MEMORY CELL

(71) Applicant: Micron Technology, Inc., Boise, ID (US)

(72) Inventors: Matthew N. Rocklein, Boise, ID (US); D. V. Nirmal Ramaswamy, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/662,974

(22) Filed: Jul. 28, 2017

(65) Prior Publication Data
US 2017/0346007 A1 Nov. 30, 2017

Related U.S. Application Data

(60) Division of application No. 14/849,715, filed on Sep. 10, 2015, now abandoned, which is a continuation of application No. 14/473,400, filed on Aug. 29, 2014, now Pat. No. 9,159,921, which is a division of application No. 13/109,052, filed on May 17, 2011, now Pat. No. 8,847,196.

(51) Int. Cl.
*H01L 45/00* (2006.01)
*H01L 27/24* (2006.01)

(52) U.S. Cl.
CPC ........ *H01L 45/146* (2013.01); *H01L 27/2463* (2013.01); *H01L 45/06* (2013.01); *H01L 45/08* (2013.01); *H01L 45/1233* (2013.01); *H01L 45/147* (2013.01); *H01L 45/1608* (2013.01); *H01L 45/1616* (2013.01); *H01L 45/1675* (2013.01)

(58) Field of Classification Search
CPC ... H01L 45/146; H01L 27/2463; H01L 45/06; H01L 45/08; H01L 45/1233; H01L 45/147; H01L 45/1608; H01L 45/1616; H01L 45/1675
USPC ........................................... 438/382
See application file for complete search history.

(56) References Cited

U.S. PATENT DOCUMENTS 5,443,994 A * 8/1995 Solheim .............. H01L 21/2255
                                                   257/E21.004
5,618,383 A * 4/1997 Randall ............... H01L 21/0271
                                                   257/E21.024

(Continued)

FOREIGN PATENT DOCUMENTS

JP        2009-224610 A    10/2009
KR   10-2010-0104015 A    12/2010

OTHER PUBLICATIONS

Office Action from related Chinese patent application No. 101117643, dated Oct. 22, 2014, 13 pp.

(Continued)

*Primary Examiner* — Ori Nadav
(74) *Attorney, Agent, or Firm* — Brooks, Cameron & Huebsch, PLLC

(57) ABSTRACT

Semiconductor memory devices, resistive memory devices, memory cell structures, and methods of forming a resistive memory cell are provided. One example method of a resistive memory cell can include a number of dielectric regions formed between two electrodes, and a barrier dielectric region formed between each of the dielectric regions. The barrier dielectric region serves to reduce an oxygen diffusion rate associated with the dielectric regions.

15 Claims, 4 Drawing Sheets

(56) References Cited

U.S. PATENT DOCUMENTS

| | | | |
|---|---|---|---|
| 5,665,997 A * | 9/1997 | Weaver | H01L 27/14625 257/414 |
| 6,146,251 A * | 11/2000 | Fukui | C09G 1/02 451/42 |
| 6,882,516 B2 | 4/2005 | Baniecki et al. | |
| 6,965,137 B2 | 11/2005 | Kinney et al. | |
| 7,400,522 B2 | 7/2008 | Toda et al. | |
| 7,419,529 B2 * | 9/2008 | Yoshii | B82Y 10/00 257/E21.209 |
| 7,544,596 B2 | 6/2009 | Ahn et al. | |
| 7,659,215 B2 | 2/2010 | Kim et al. | |
| 7,662,614 B2 * | 2/2010 | Ma | B82Y 20/00 435/287.1 |
| 7,893,471 B2 | 2/2011 | Horiuchi | |
| 8,097,903 B2 | 1/2012 | Inaba et al. | |
| 8,558,212 B2 | 10/2013 | Jo | |
| 8,669,837 B2 * | 3/2014 | Gerster | F02M 51/0653 335/281 |
| 2002/0084481 A1 | 7/2002 | Lian et al. | |
| 2002/0115252 A1 | 8/2002 | Haukka et al. | |
| 2004/0141136 A1 * | 7/2004 | Nimura | G02F 1/133553 349/144 |
| 2005/0003276 A1 * | 1/2005 | Sakai | H01M 6/181 429/306 |
| 2006/0006374 A1 * | 1/2006 | Chang | H01L 45/06 257/2 |
| 2006/0006471 A1 | 1/2006 | Rossel et al. | |
| 2007/0018219 A1 | 1/2007 | Lim et al. | |
| 2008/0173975 A1 * | 7/2008 | Chen | H01L 27/2463 257/529 |
| 2008/0265236 A1 | 10/2008 | Lee et al. | |
| 2009/0027976 A1 | 1/2009 | Brewer et al. | |
| 2009/0039332 A1 | 2/2009 | Lee et al. | |
| 2009/0134499 A1 | 5/2009 | Ahn et al. | |
| 2009/0152526 A1 | 6/2009 | Courtade et al. | |
| 2009/0174519 A1 * | 7/2009 | Mikawa | H01L 27/101 338/20 |
| 2009/0218565 A1 | 9/2009 | Kawano et al. | |
| 2009/0283736 A1 * | 11/2009 | Kanzawa | G11C 13/0007 257/2 |
| 2009/0321709 A1 | 12/2009 | Muraoka et al. | |
| 2010/0065803 A1 | 3/2010 | Choi et al. | |
| 2010/0102289 A1 | 4/2010 | Dimitrov et al. | |
| 2010/0119441 A1 * | 5/2010 | Kodama | B01J 23/745 423/658 |
| 2010/0163823 A1 | 7/2010 | Sim et al. | |
| 2010/0314602 A1 | 12/2010 | Takano et al. | |
| 2011/0006275 A1 | 1/2011 | Roelofs et al. | |
| 2011/0248236 A1 | 10/2011 | Kim et al. | |
| 2012/0261638 A1 | 10/2012 | Sills et al. | |
| 2013/0009261 A1 * | 1/2013 | Sun | G11C 11/16 257/421 |
| 2013/0082232 A1 | 4/2013 | Wu et al. | |

OTHER PUBLICATIONS

International Search Report and Written Opinion for related PCT Application No. PCT/US2012/037072, dated Nov. 23, 2012, 10 pps.

Bao, Dinghua. "Transition metal oxide thin films for nonvolatile resistive random access memory applications" Journal of the Ceramic Society of Japan, Sep. 2009. pp. 929-934 vol. 117 No. 1369.

Jo, Sung Hyun. "Nanoscale Memristive Devices for Memory and Logic Applications" 2010, 31 pp.

Wang, Sheng-Yu, et al. "Controllable Oxygen Vacanies to Enhance Resistive Switching Performance in a Zro2-based Rram with Embedded Mo Layer" Nov. 11, 2010. vol. 21. Abstract 1 page.

* cited by examiner

RESISTIVE MEMORY CELL

PRIORITY INFORMATION

This application is a Divisional of U.S. application Ser. No. 14/849,715 filed Sep. 10, 2015, which is a Continuation of U.S. application Ser. No. 14/473,400 filed Aug. 29, 2014, now U.S. Pat. No. 9,159,921, which is a Divisional of U.S. application Ser. No. 13/109,052 filed May 17, 2011, now U.S. Pat. No. 8,847,196, the specifications of which are incorporated herein by reference.

TECHNICAL FIELD

The present disclosure relates generally to semiconductor memory devices and methods, and more particularly, to resistive memory devices, cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, and flash memory, among others. Types of resistive memory include programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

RRAM devices include resistive memory cells that store data based on the resistance level of a storage element. The cells can be programmed to a desired state, e.g., corresponding to a particular resistance level, such as by applying sources of energy, such as positive or negative voltages to the cells for a particular duration. Some RRAM cells can be programmed to multiple states such that they can represent, e.g., store, two or more bits of data.

The programmed state of a resistive memory cell may be determined, e.g., read, for example, by sensing current through the selected resistive memory cell responsive to an applied interrogation voltage. The sensed current, which varies based on the resistance level of the memory cell, can indicate the programmed state of the resistive memory cell.

A two-state resistive memory cell can have a low resistance state and a high resistance state. Each respective resistance state can correspond with a logic state, e.g., "0" or "1." According to a previous resistive memory cells approach, the low resistance state can occur due to a non-volatile formation of one or more conductive filaments in a dielectric between electrodes, and the high resistance state can occur due to a non-volatile dissolution of the conductive filament(s) in the dielectric. Ions in the dielectric and/or electrode(s) can be re-located by the application of electrical energy to form or dissolve a conductive filament. A relatively smaller application of electrical energy can be used to ascertain the resistive state.

DETAILED DESCRIPTION

Figure 1:
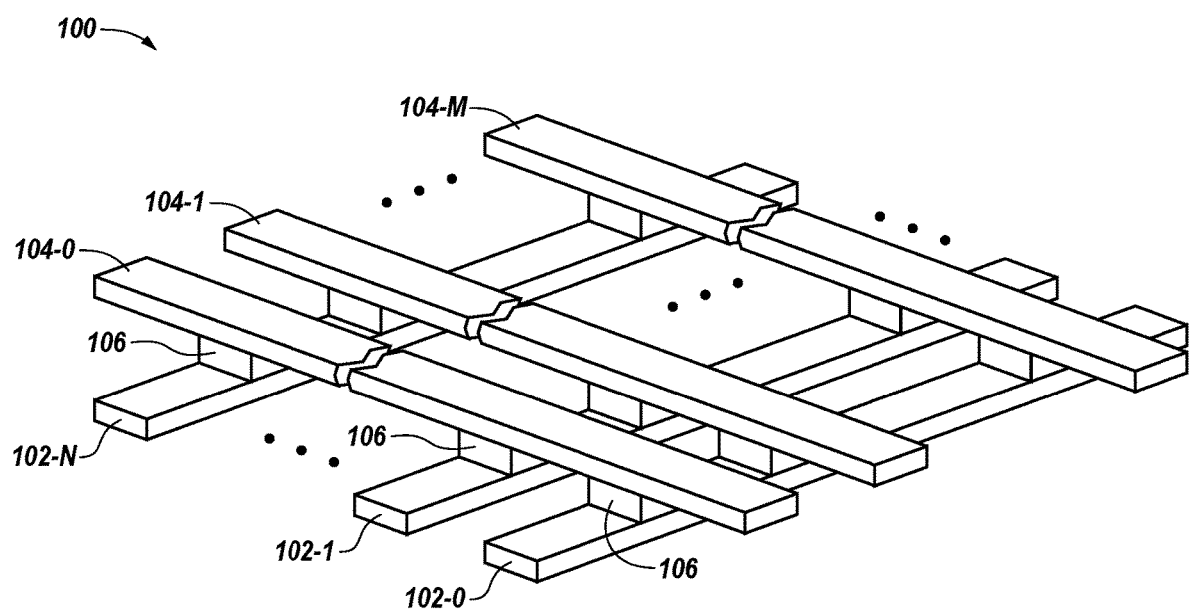
FIG. 1 is a block diagram of a portion of an array of resistive memory cells in accordance with one or more embodiments of the present disclosure.

Semiconductor memory devices, resistive memory devices, memory cell structures, and methods of forming a resistive memory cell are provided. One example method of a resistive memory cell can include a number of dielectric regions formed between two electrodes, and a barrier dielectric region formed between each of the dielectric regions. The barrier dielectric region serves to reduce an oxygen diffusion rate associated with the dielectric regions.

Embodiments of the present disclosure can provide benefits such as resistive memory cells having multiple states and/or improved switching characteristics as compared to previous resistive memory cells, among other benefits. As described further herein, forming a slow oxygen diffusion barrier and/or grain boundary disruptor between dielectric portions of a resistive memory cell can have various benefits, such as multiple states and/or improved switching characteristics. The dielectric and/or barrier dielectric regions can be formed, for example, via an atomic layer deposition (ALD) process, which is well-suited to deposit dielectric materials with sub-nanometer thickness control. The present disclosure provides dielectric laminates and alloys that support one or more of the following benefits: 1) controlled oxygen diffusion barriers, 2) grain-boundary disruption, 3) crystalline or amorphous control, and 4) reduced dielectric roughness by control of grain size, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of a portion of an array 100 of memory cells 106 in accordance with one or more embodiments of the present disclosure. Memory devices may include a number of memory cells 106 arranged in a matrix, e.g., array, 100. A memory cell may include a storage element coupled to a select device, e.g., an access device. The storage element can include a programmable portion that may have a variable resistance, for example. The access device can be a diode, field effect transistor (FET), or bipolar junction transistor (BJT), among others. In the example illustrated in FIG. 1, the array 100 is an array including a first number of access conductive lines 102-0, 102-1, . . . , 102-N, e.g., access lines, which may be referred to herein as word lines, and a second number of data/sense conductive lines 104-0, 104-1, . . . , 104-M, e.g., data lines, which may be referred to herein as bit lines. As illustrated, the word lines 102-0, 102-1, . . . , 102-N are substantially parallel to each other and are substantially orthogonal to the bit lines 104-0, 104-1, . . . , 104-M, which are substantially parallel to each other; however, embodiments are not so limited.

As used herein, the term "substantially" intends that the modified characteristic need not be absolute, but is close enough so as to achieve the advantages of the characteristic. For example, "substantially parallel" is not limited to absolute parallelism, and can include structure orientations that are non-intersecting for a given application and at least closer to a parallel orientation than a perpendicular orientation.

In this example, a memory cell 106 is located at each of the intersections of the word lines 102-0, 102-1, . . . , 102-N and bit lines 104-0, 104-1, . . . , 104-M. The memory cells 106 can function in a two-terminal architecture e.g., with a particular word line 102-0, 102-1, . . . , 102-N and bit line 104-0, 104-1, . . . , 104-M serving as a bottom and top electrode. A memory cell may be coupled to a word line forming a "row" of the array. Each memory cell may be coupled to a bit line forming a "column" of the array.

According to one or more embodiments, the memory cells 106 of array 100 can be resistive memory cells such as those described in connection with FIGS. 2, 3A, 3B, 4A and 4B. More particularly, the memory cells 106 of array 100 can be configured as a resistive random access memory (RRAM).

As previously mentioned, the storage element can include a programmable portion. The programmable portion may be programmable to a number of different logic states. For instance, the programmable portion of a storage element can be programmed to particular levels corresponding to particular logic states responsive to applied programming voltage and/or current pulses. The programmable portion of a storage element can include, for example, one or more materials such as a transition metal oxide material or a perovskite including two or more metals, e.g., transition metals, alkaline earth metals, and/or rare earth metals. Embodiments are not limited to a particular material or materials associated with the programmable portion of a storage element of the memory cells 106. For instance, the programmable portion of a storage element can be formed of various doped or undoped materials. Other examples of materials that can be used to form the programmable portion of a storage element include binary metal oxide materials, colossal magnetoresistive materials, and/or various polymer-based resistive variable materials, among others.

In operation, the memory cells 106 of array 100 can be programmed by applying a voltage, e.g., a write voltage, across the memory cells 106 via selected word lines 102-0, 102-1, . . . , 102-N and bit lines 104-0, 104-1, . . . , 104-M. The width and/or magnitude of the voltage pulses across the memory cells 106 can be adjusted, e.g., varied, in order to program the memory cells 106 to particular logic states, e.g., by adjusting a resistance level of the storage element.

A sensing, e.g., read, operation can be used to determine the logic state of a memory cell 106 by a magnitude of sensing current, for example, on a bit line 104-0, 104-1, . . . , 104-M corresponding to the respective memory cell 106 responsive to a particular voltage applied to the selected word line 102-0, 102-1, . . . , 102-N to which the respective cell 106 is coupled. Sensing operations can also include biasing unselected word lines and bit lines at particular voltages in order to sense the logic state of a selected cell 106.

Figure 2:
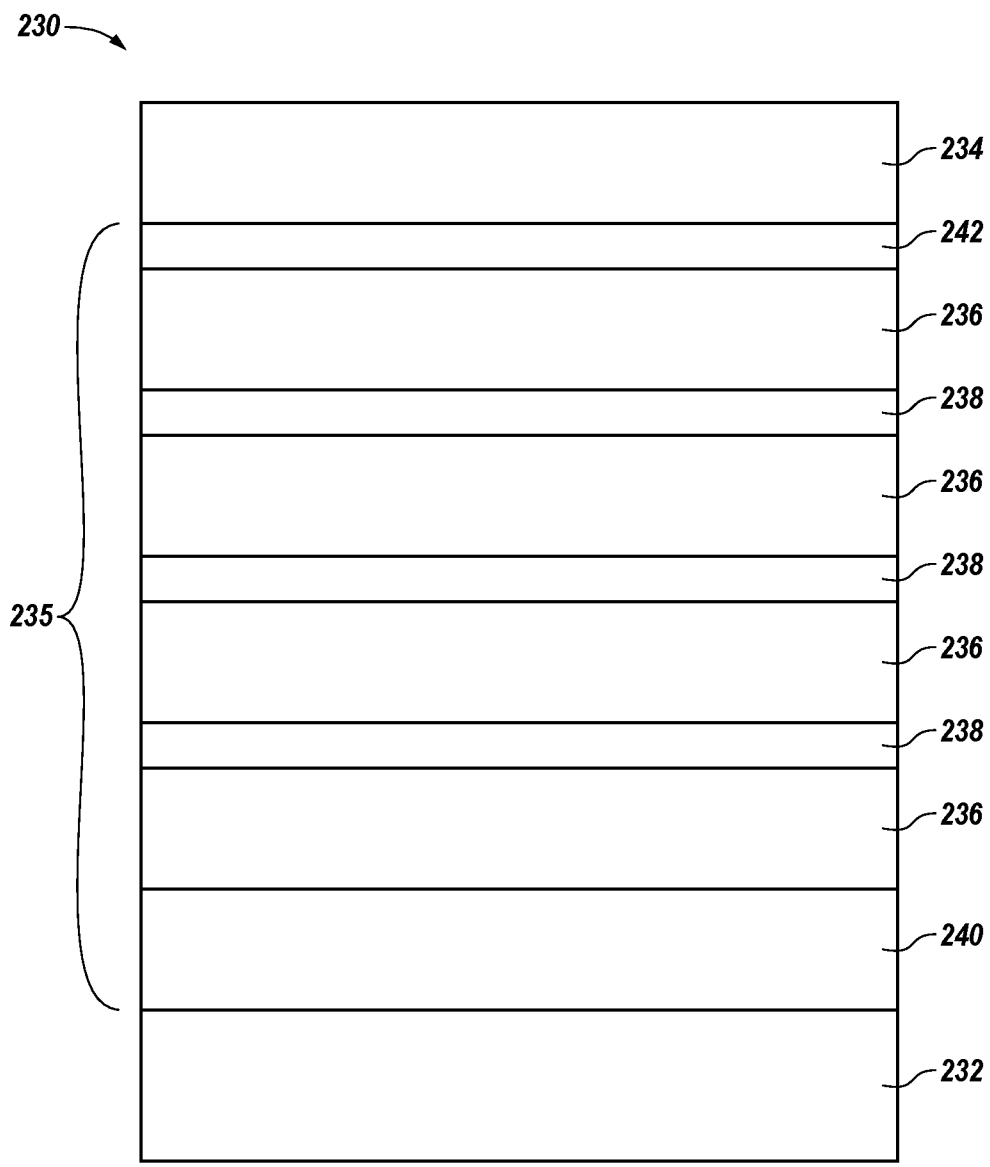
FIG. 2 illustrates a cross-sectional view of a portion of multi-state resistive memory cells in accordance with one or more embodiments of the present disclosure.

FIG. 2 illustrates a cross-sectional view of a portion of a resistive memory cell including a dielectric and barrier dielectric in accordance with one or more embodiments of the present disclosure. According to one or more embodiments of the present disclosure, one or more thin, discrete barrier dielectric materials can create local changes in ion diffusion rates, e.g., oxygen ion diffusion rates, through a bulk dielectric so that a conductive filament extending from cathode to anode can be avoided for certain programming energies. Discrete barrier dielectric materials within bulk dielectric materials can result in discrete regions of stoichiometric oxides and sub-oxides being created under programming, next to a highly oxygen-deficient and oxygen-loving electrode.

The resistive memory cell structure illustrated in FIG. 2, for example, can provide improved controllability and/or multiple write states over the art. Multiple write states in a resistive memory device can increase bit densities in memory devices such as RRAM. Additionally, for crystalline dielectrics, benefits can also be achieved by the discrete barrier dielectric materials causing grain-boundary disruption with respect to the bulk dielectric materials. Certain problems of resistive memory device performance, for example within an RRAM, such as cycling and/or bit-to-bit reproducibility, may arise if the switching mechanism is "filamentary" in nature. Crystalline grain-boundaries are often both leakage paths and oxygen diffusion paths. By disrupting the grains with one or more grain-boundaries, e.g., created at an interface of a barrier dielectric material and dielectric material, the pathways can be broken between electrodes such that filamentary switching will be prevented, or at least reduced and moderated, which can provide improved cell-to-cell performance consistency. For instance, cell-to-cell performance can be based on the average of many filamentary switching events, e.g., within a greater number of discrete dielectric material regions, rather than that of a single filamentary switching event, e.g., from cathode to anode.

FIG. 2 illustrates a cross-sectional view of a portion of multi-state resistive memory cells in accordance with one or more embodiments of the present disclosure. As described above with respect to a prior art resistive memory cell, a two-state resistive memory cell can have a low resistance state and a high resistance state, each respective resistance state being associated with a corresponding logic state, e.g., "0" and "1." A multi-state resistive memory cell can have a number of intermediate resistance states between the lowest resistance state and the highest resistance state. A respective intermediate resistance state can be associated with a corresponding logic state.

FIG. 2 shows a cross-sectional view of a portion of a resistive memory cell 230. Resistive memory cell 230 can include a thin film comprising a number of solid laminate dielectric materials 235 between electrodes, e.g., a cathode and an anode, as shown in FIG. 2. The laminate dielectric materials 235 can include alternating dielectric 236 regions and barrier dielectric 238 regions, e.g., layers. The laminate dielectric materials 235 can further include an optional buffer dielectric region 240 between the dielectric region 236 closest to electrode 232 and electrode 232. The laminate dielectric materials 235 can also include an additional barrier dielectric 242 region between the dielectric region 236 furthest away from an electrode 232, and the electrode 234. The electrode 232 can be a metal alloy anode, and an electrode 234 can be a metal cathode.

Although not shown in FIG. 2, the electrode 232, 234 can be coupled to a word line or bit line of a memory array, such as is shown in FIG. 1. A control transistor can also be associated with each resistive memory cell 230 for selection thereof. The electrodes 232 and 234 can be comprised of the same or different materials and can have the same or different physical sizes and/or shapes. The resistive memory cell 230 can be symmetric or asymmetric.

Example electrode materials include a metal or metal alloy, such as titanium, tungsten, and platinum, or combinations thereof, although embodiments are not limited to particular electrode materials. More particularly, one electrode 232 can be comprised of material that is relatively inert, e.g., titanium nitride (TiN) or platinum. Another electrode 234 can be a material that is electrochemically active, e.g., titanium. However, embodiments of the present disclosure are not so limited, and the electrode 234 may be nickel, strontium, hafnium, zirconium, tantalum, aluminum, and/or tungsten, among other metals and/or combinations thereof.

The number of laminate dielectric materials 235 can include alternating dielectric regions 236 and barrier dielectric regions 238, e.g., alternating layers of dielectric materials and barrier dielectric materials. An optional buffer dielectric material 240 may be located adjacent the electrode 232, e.g., between the electrode 232 and a nearest dielectric region 236. An optional barrier dielectric material 242 may be located adjacent electrode 234, e.g., between electrode 234 and a nearest dielectric region 236. According to one or more embodiments, a resistive memory cell 230 includes at least two dielectric regions 236 having a barrier dielectric region 238 therebetween. According to one or more embodiments, a resistive memory cell 230 includes a plurality of barrier dielectric materials 238, each barrier dielectric region 238 being located between dielectric regions 236, such that the barrier dielectric materials 238 and dielectric regions 236 alternate.

According to an example method of forming a resistive memory cell in accordance with one or more embodiments of the present disclosure, a dielectric region 236 is formed on an electrode 232, and a barrier dielectric region 238 is formed on the dielectric region 236. Another dielectric region 236 is formed on the barrier dielectric region 238, and then electrode 234 is formed on the another dielectric region 236. The barrier dielectric region 238 is a material having a slower oxygen diffusion rate and/or serves as a grain-boundary disruptor relative to the dielectric regions 236.

According to another example method of forming a resistive memory cell in accordance with one or more embodiments of the present disclosure, an optional buffer dielectric material 240 can be formed on electrode 232. One or more instances of a dielectric region 236 and a barrier dielectric region 238 are formed on the optional buffer dielectric material 240, with a dielectric region 236 being adjacent the optional buffer dielectric material 240. Another dielectric region 236 is formed on the one or more instances of the dielectric region 236 and the barrier dielectric region 238, such that it is located adjacent a barrier dielectric region 238 and furthest away from the electrode 232.

An optional barrier dielectric material 242 can be formed on the dielectric region 236 located furthest away from electrode 232, and electrode 234 can be formed on the optional barrier dielectric material 242 (if present). If the optional buffer dielectric 240 is not formed, the one or more instances of a dielectric region 236 and a barrier dielectric region 238 can be formed directly on electrode 232. Also, if the optional barrier dielectric material 242 is not included in the resistive memory cell, electrode 234 can be formed directly on the dielectric region 236 located furthest away from electrode 232.

The resistive memory cell 230 can be an oxide based RRAM cell, for example. An oxide based resistive memory cell 230 can refer to a cell that includes a resistive oxide material, e.g., an oxygen source as the dielectric region 236 and/or barrier dielectric region 238 between the two electrodes 232 and 234. Some oxide based memory cells can include one or more additional oxide materials and/or second electrodes along with the oxide material(s) between the two electrodes.

Examples of metal oxides ($MO_X$) that can be included in the dielectric region 236 include a near-stoichiometric, stoichiometric, and/or sub-stoichiometric metal oxide material. A near-stoichiometric oxide can be an oxide that has an oxygen percentage at or approximately at a stoichiometric ratio for the oxide. A sub-stoichiometric oxide can be an oxide that has an oxygen percentage below a stoichiometric ratio for the oxide.

According to one or more embodiments, the dielectric region 236 can include titanium dioxide ($TiO_2$). According to some embodiments, the dielectric region 236 can include other metal oxides such as lanthanum oxide ($La_2O_3$), lanthanum aluminate ($LaAlO_3$), gallium oxide ($Ga_2O_3$), zirconium oxide ($ZrO_2$,), zirconium silicon oxide ($Zr_xSi_yO_z$), zirconium titanium oxide ($Zr_xTi_yO_z$), hafnium oxide ($HfO_2$), hafnium titanium oxide ($Hf_xTi_yO_z$), strontium titanate ($SrTiO_3$), lanthanum calcium manganese oxide (LCMO), magnesium oxide (MgO), aluminum oxide ($Al_xO_y$) such as $Al_2O_3$, tin dioxide ($SnO_2$), zinc peroxide ($ZnO_2$), titanium silicon oxide ($Ti_xSi_yO_z$), and/or a hafnium silicon oxide ($Hf_xSi_yO_z$), among other metal oxide materials that are suitable oxygen sources. However, embodiments are not limited to the dielectric region 236 including metal oxides, and the dielectric region 236 can be formed using other resistive metal alloys. The dielectric regions 236 can be formed to be amorphous, crystalline, or combinations thereof. For example, one dielectric region 236 can be amorphous and another one dielectric region 236 can be crystalline.

The barrier dielectric region 238 is a slow oxygen diffusion barrier and/or grain-boundary disruptor material with respect to the dielectric regions 236. The resistive state of the resistive memory cell 230, fabricated in accordance with the present disclosure, can change depending on the location of the oxygen ions within the laminate dielectric materials 235 between the two electrodes. The inclusion of barrier dielectric region 238 between instances of the bulk dielectric region 236 is intended to disrupt the formation of continuous filaments between the cathode and anode. As such, the barrier dielectric region 238 can have a bulk anion, e.g., oxygen, diffusion rate that differs from that of the dielectric region 236 alone.

Examples of materials that can be included in the barrier dielectric region 238 include zirconium oxide ($ZrO_2$), silicon dioxide ($SiO_2$), and aluminum oxide ($Al_xO_Y$) such as $Al_2O_3$, among others. Barrier dielectric region 238 can be formed to be amorphous or crystalline. Where multiple barrier dielectric regions 238 are formed, some may be amorphous and others may be crystalline. Also, a barrier dielectric region 238 may be amorphous adjacent an amorphous or crystalline dielectric region 236, or may be crystalline adjacent an amorphous or crystalline dielectric region 236.

Where the dielectric region 236, e.g., $TiO_2$, is formed to have a crystalline structure, the dielectric material anion, e.g., oxygen, can diffuse out more rapidly along boundaries of the dielectric region 236. The barrier dielectric region 238 can serve to disrupt the grain boundaries of the dielectric region 236, thereby helping to moderate the diffusion paths and reduce filamentary properties, for instance.

According to one or more embodiments, one or more portions of the dielectric region 236 may be formed from a different material than another portion of the dielectric region 236. That is, the various dielectric regions 236 may be, but need not be, formed from a same, e.g., metal oxide, material. According to one or more embodiments, one or more portions of the barrier dielectric region 238 may be formed from a different material than another portion of the barrier dielectric region 238.

According to one or more embodiments, the dielectric and/or barrier dielectric regions can be discrete regions with well-defined boundaries. However, embodiments of the present disclosure are not so limited, and the dielectric and/or barrier dielectric regions can be formed having less than discrete boundaries. For example, regions can be defined by a gradual transition from one material to another, e.g., a gradient, such as between dielectric and barrier dielectric materials rather than an abrupt and distinct transition. As previously mentioned, the dielectric and/or barrier dielectric regions can be formed, for example, via an atomic layer deposition (ALD) process, which is well-suited to deposit dielectric materials with sub-nanometer thickness control.

According to various embodiments of forming a resistive memory cell, a single bulk film of metal oxide, e.g., $Zr_xSi_yO_z$, $Hf_xSi_yO_z$, $Ti_xSi_yO_z$, is formed by ALD. During the ALD, an initial quantity of metal oxide material is deposited, after which the metal oxide is appropriately doped and/or augmented by a barrier dielectric material for some intermediate quantity of material deposition, after which another quantity of metal oxide material is deposited. The dielectric/barrier dielectric/dielectric structure can exist within a single bulk film. The barrier dielectric region can be a region intermediate to the surrounding metal oxide regions. As such, the barrier dielectric region can be a mixture including the metal oxide and/or having a gradient from metal oxide to doped/augmented metal oxide and/or barrier dielectric material, and back to metal oxide.

According to various embodiments, the optional buffer dielectric material 240, located between the electrode 232 and the dielectric region 236 located closest to the electrode 232 may have non-reactive stable electrical properties. According to some embodiments, the optional buffer dielectric material 240 can have a lower dielectric constant (i.e., k) value, and thus a greater resistance, than the dielectric regions 236, e.g., the dielectric region 236 located closest to electrode 232. According to some embodiments, the optional buffer dielectric material 240 can have a greater dielectric constant (i.e., k) value, and thus a lesser resistance, than the dielectric regions 236, e.g., the dielectric region 236 located closest to electrode 232. The optional buffer dielectric material 240 can have a higher resistance than the dielectric regions 236 in order to function as a current limiting material in the resistive memory cell, e.g., especially when the resistive memory cell is in a low resistance state. Accordingly, the optional buffer dielectric material 240 can serve as a tunable material for the resistive memory cell with respect to the resistive and dielectric properties thereof. For example, the optional buffer dielectric material 240 can be a material having an appropriate resistance to limit current to a desired magnitude with respect to a particular memory cell structure.

The optional buffer dielectric material 240 can also be selected, in part, to have appropriate adhesion properties with respect to the electrode 232. That is, the optional buffer dielectric material 240 can provide an adhesion interface between electrode 232 and a dielectric region 236 located closest to electrode 232. According to some embodiments, the optional buffer dielectric material 240 doesn't deplete an anion element. The optional buffer dielectric material 240 can prevent or mitigate switching of the resistive memory cell from switching at electrode 232. According to various embodiments, the optional barrier dielectric 242 can be formed as any other barrier dielectric region 238, and include similar materials.

The dielectric region 236, barrier dielectric region 238, optional buffer dielectric material 240, and optional barrier dielectric 242 can be formed, e.g., deposited, via an atomic layer deposition (ALD) process or other suitable deposition process. According to one or more embodiments, the dielectric region 236 and barrier dielectric region 238 are formed with sub-nanometer thickness control, to which ALD is well-suited. However, embodiments are not limited to a particular deposition process. In some embodiments, the dielectric region 236 can have a thickness of from about 10 to about 100 Angstroms, the barrier dielectric region 238 can have a thickness of less than about 20 Angstroms, e.g., from about 2 to about 20 Angstroms, and the thin film comprising a number of laminate dielectric materials 235 can have a thickness of less than about 1000 Angstroms, e.g., from about 50 to about 1000 Angstroms. However, embodiments are not limited to a particular thickness of dielectric region 236, barrier dielectric region 238, or the thin film comprising a number of laminate dielectric materials 235.

The electrodes 232 and/or 234 can be formed via an ALD process, in situ using a CVD process, or other suitable deposition process. Additional materials, e.g., materials other than a metal associated with electrode 234, such as additional materials associated with the metal precursor source, e.g., titanium chloride, titanium tetrachloride ($TiCl_4$), chlorine, as well as other precursor materials and/or reactants, e.g., hydrogen, argon, etc., associated with an in situ CVD process can react with previously formed dielectric region 236, e.g., titanium oxide, or optional barrier dielectric material 242 and contribute to the formation of the electrodes. Some examples of precursor materials include, but are not limited to, hydrogen, argon, e.g., argon plasma, and/or a titanium chloride material such as titanium tetrachloride, titanium trichloride, or titanium dichloride, for example.

The formation of electrode 234 onto a dielectric region 236 can result in a reaction that can create a "reacted" metal oxide (not shown in FIG. 2) at the interface between electrode 234 and a deposited metal oxide material 236. The reacted metal oxide can include materials such as aluminum oxide ($Al_XO_Y$), aluminum titanium oxide ($Al_XTi_YO_Z$), aluminum hafnium oxide ($Al_XHf_YO_Z$), silicon oxide ($Si_XO_Y$), silicon oxynitride ($Si_XO_YN_Z$), hafnium silicon oxide ($Hf_X$-$Si_YO_Z$), zirconium silicon oxide ($Zr_XSi_YO_Z$), zirconium silicon oxynitride ($Zr_WSi_XO_YN_Z$), hafnium oxide ($Hf_XO_Y$), zirconium oxide ($Zr_XO_Y$), titanium oxide ($Ti_XO_Y$), hafnium zirconium oxide ($Hf_XZr_YO_Z$), hafnium titanium oxide ($Hf_X$-$Ti_YO_Z$), zirconium titanium oxide ($Zr_XTi_YO_Z$), and/or strontium oxide ($Sr_XO_Y$), among other materials.

The resistivity of the metal oxide portion of the resistive memory cell 230 can be dependent on the location of oxygen ions and can change as the location of the oxygen ions change, either in dielectric regions 236 or the reacted metal oxide portion. For example, where dielectric region 236 located furthest away from electrode 232 is titanium dioxide ($TiO_2$), electrode 234 is titanium, and a plasma CVD (PECVD) process used to deposit materials includes a titanium tetrachloride ($TiCl_4$) metal precursor source along with hydrogen ($H_2$) and an argon plasma component, the metal oxide portion can be a sub-stoichiometric titanium oxide ($TiO_{2-x}$). Regardless, embodiments of the resistive memory cell of the present disclosure are not limited to those materials shown in FIG. 2, and may include other materials formed during the formation of the materials shown in FIG. 2.

The resistance (and therefore the logic state) of the resistive memory cell 230 can change depending on the location of the ions, e.g., oxygen. However, the presence of the barrier dielectric region 238 between dielectric regions 236 interferes with the formation of a conductive filament extending from the cathode to the anode. A resistive memory cell in which a conductive filament extending from the cathode to the anode in a continuous dielectric typically has only two resistive (and logic) states, a high resistance state (i.e., conductive filament present) and a low resistance state (i.e., conductive filament not present).

The state of resistive memory cell 230 can be read by applying a read voltage across the resistive memory cell 230 via electrodes 232, 234. The state of resistive memory cell 230 can be programmed by applying a programming voltage across the resistive memory cell 230 via electrodes 232, 234 sufficient to cause ion, e.g., oxygen ion for metal oxide materials, vacancy movement. When an electric field is applied, the ion vacancies drift, which is reversible by changing the direction of the current through the resistive memory cell. The migration of ion vacancies in resistive memory cell can occur due to application of pulsed voltages and/or voltages of different magnitudes. The resistance, and corresponding logic state, of resistive memory cell 230 can be set to a desired value by applying an appropriate voltage pulse/magnitude.

According to one or more embodiments of the present disclosure, a resistive memory cell 230 formed having at least one instance of barrier dielectric region 238 between dielectric regions 236 can be operated to have more than two resistance (logic) states. Resistance of resistive memory cell 230 does not switch from a highest resistance state to a lowest resistance state (or from a lowest resistance state to a highest resistance state) all at once, thereby providing one or more stable, non-volatile resistive states (and corresponding logic states) in between the lowest and highest resistance states, as well as improved switching control. Rather than switching rapidly to/from a highest resistive state directly to a lowest resistive state, conductivity of resistive memory cell 230 increases (i.e., resistance decreases) to a greater extent in those dielectric regions 236 located closest to electrode 234 for a given applied programming voltage. That is, as a result of an applied programming voltage the two dielectric regions 236 shown in FIG. 2 located closest to the second electrode may be most conductive, the dielectric region 236 located next closest to electrode 234 may be somewhat conductive, and the dielectric region 236 located closest to electrode 232 may be mostly insulative, resulting in a cumulative resistance between electrode 232 and electrode 234 intermediate between a low resistance state and a high resistance state.

With appropriate application of programming voltage in excess of a threshold voltage/duration for a given resistance state, an increased number of dielectric regions 236 can be controlled to be conducive, the level of conductivity for each particular dielectric region decreases based on distance from electrode 234 towards electrode 232. A plurality of programming voltage magnitude/durations can correspond to a plurality of discreet total resistance levels for the resistive memory cell. Conversely, with appropriate application of a reverse polarity of programming voltage, an increased number of dielectric regions 236 can be controlled to be more insulative based on distance from electrode 232 towards electrode 234.

The resistive switching characteristics can vary depending on factors such as the particular dielectric and barrier dielectric materials involved, the number and arrangement of instances of a dielectric region 236 and a barrier dielectric region 238, use of the optional buffer dielectric material 240 and/or optional barrier dielectric material 242, among other factors. Increasing the number of instances of dielectric 236/barrier dielectric 238 regions can provide an increasing quantity of stable resistance states (and corresponding logic states). Additionally, an increasing number of instances of dielectric 236/barrier dielectric 238 regions can provide increasing granularity of resistance control, and thus generally improving switching characteristics.

Figure 3A:
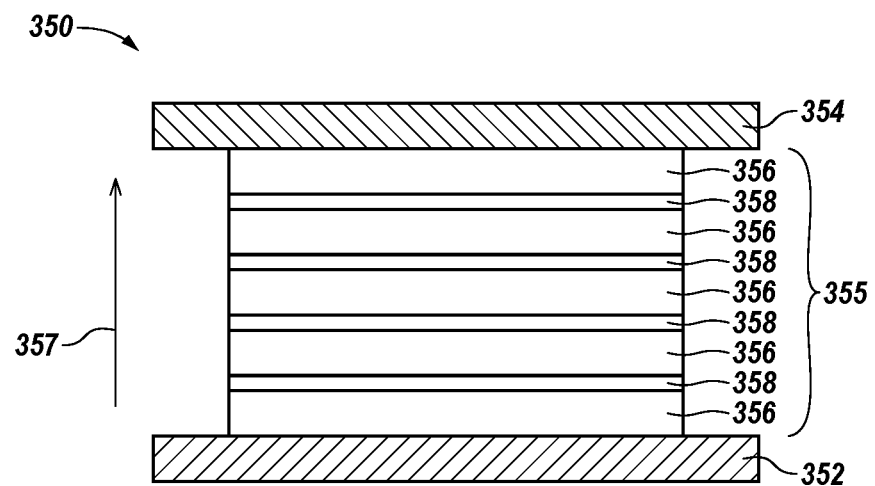
FIGS. 3A-3B illustrate cross-sectional views of a portion of a resistive memory cell having dielectric and barrier dielectric materials formed horizontally in accordance with one or more embodiments of the present disclosure.
Figure 3B:
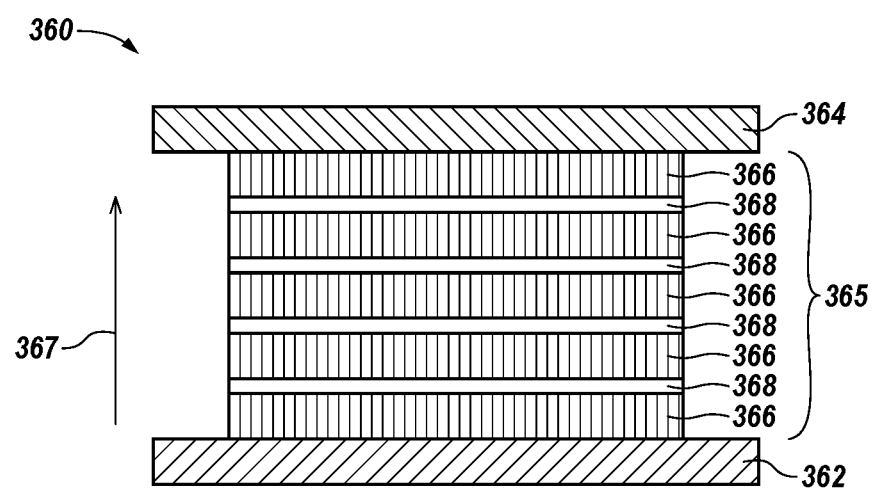

FIGS. 3A-3B illustrate cross-sectional views of a portion of a resistive memory cell having dielectric and barrier dielectric regions formed horizontally in accordance with one or more embodiments of the present disclosure. FIG. 3A shows a resistive memory cell 350 comprising a number of laminate dielectric regions 355 between two electrodes 352 and 354. The number of laminate dielectric regions 355 comprise alternating instances of dielectric regions 356 and barrier dielectric regions 358, with dielectric regions 356 being located adjacent each electrode. The resistive memory cell 350 is fabricated using horizontal laminates. That is, each successive material is deposited on previously deposited materials such that the materials are "grown" from the bottom-up, as indicated in FIG. 3A at 357. FIG. 3A shows that the instances of dielectric regions 356 and barrier dielectric regions 358 are formed substantially parallel to the electrode 352.

According to an example method of forming a resistive memory cell 350 in accordance with one or more embodiments of the present disclosure, a dielectric region 356 is formed on an electrode 352, and a barrier dielectric region 358 is formed on the dielectric region 356. Additional instances of alternating dielectric region 356 and barrier dielectric region 358 are formed until electrode 354 is formed on last dielectric region 356, e.g., located furthest away from the electrode 352. The barrier dielectric region 358 is a slow oxygen diffusion barrier and/or grain-boundary disruptor material with respect to the dielectric regions 356.

The resistive memory cell 360 can also fabricated using horizontal laminates. That is, each successive material can be deposited on previously deposited materials such that the materials are "grown" from the bottom-up, as indicated in FIG. 3B at 367.

According to one or more embodiments, each of the dielectric regions 356 and barrier dielectric regions 358 are formed to be amorphous, such that the boundary between the dielectric regions 356 and barrier dielectric regions 358 are an amorphous/amorphous boundary. That is, resistive memory cell 350 includes amorphous/amorphous laminates.

FIG. 3B shows a resistive memory cell 360 having a thin film comprising a number of solid laminate dielectric regions 365 between two electrodes 362 and 364. The number of laminate dielectric regions 365 comprise alternating instances of dielectric regions 366 and barrier dielectric regions 368, with dielectric regions 366 being located adjacent each electrode. The resistive memory cell 360 is fabricated using horizontal formation of the various materials, as described with respect to the resistive memory cell illustrated in FIGS. 3 and 4A. FIG. 3B shows that the instances of dielectric regions 366 and barrier dielectric regions 368 are formed substantially parallel to the electrode 362.

According to one or more embodiments, each of the barrier dielectric regions 368 of resistive memory cell 360 are formed to be amorphous; however, each of the dielectric regions 366 of resistive memory cell 360 are formed to be crystalline, as may be achieved by annealing, for example. Therefore, the boundary between the dielectric regions 366 and barrier dielectric regions 368 are a crystalline/amorphous boundary. That is, resistive memory cell 360 includes crystalline/amorphous laminates.

Figure 4A:
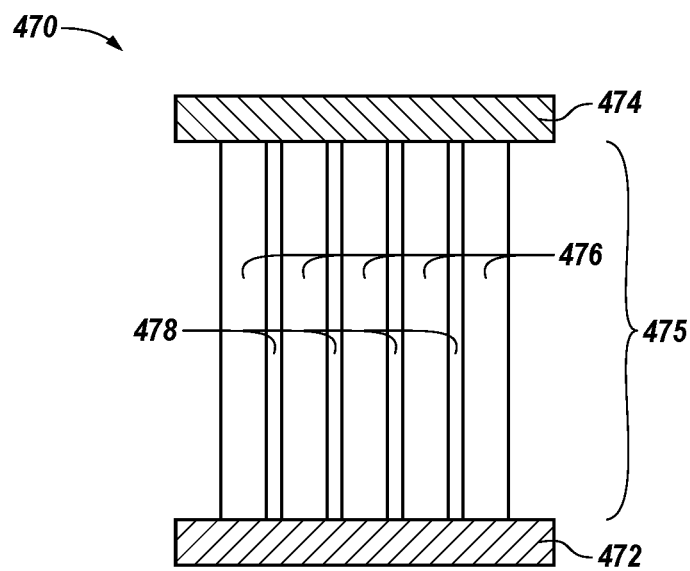
FIGS. 4A-4B illustrate cross-sectional views of a portion of a resistive memory cell having dielectric and barrier dielectric materials formed vertically in accordance with one or more embodiments of the present disclosure.
Figure 4B:
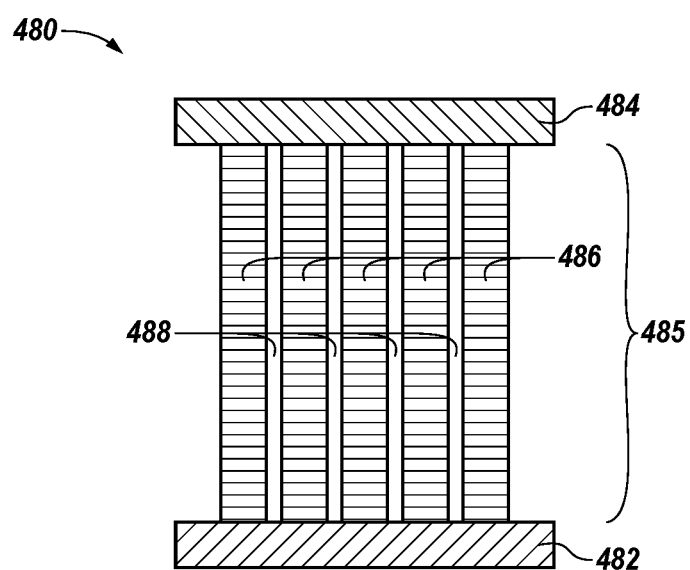

FIGS. 4A-4B illustrate cross-sectional views of a portion of a resistive memory cell having dielectric and barrier dielectric regions formed vertically in accordance with one or more embodiments of the present disclosure. FIG. 4A shows a resistive memory cell 470 comprising a number laminate dielectric regions 475 between two electrodes 472 and 474. The number of laminate dielectric regions 475 comprise alternating instances of dielectric regions 476 and barrier dielectric regions 478. However, the instances of dielectric regions 476 and barrier dielectric regions 478 are formed using vertical laminates. That is, the instances of dielectric regions 476 and barrier dielectric regions 478 are formed substantially perpendicular to the electrode 472.

As used herein, the term "substantially" intends that the modified characteristic need not be absolute, but is close enough to the characteristic so as to achieve the advantages of the characteristic. For example, "substantially perpendicular" is not limited to absolute perpendicularity, and can include structure orientations that are oriented sufficiently close to being at a right angle to one another so as to achieve the advantages associated with a perpendicular orientation. For example, "substantially perpendicular" intends at least being closer to an orthogonal orientation than to a parallel orientation.

According to an example method of forming a resistive memory cell 470 in accordance with one or more embodiments of the present disclosure, electrode 472 is formed. Bulk dielectric material 476 is formed, e.g., deposited, on the electrode 472. The bulk dielectric material 476 is patterned, etched, and filled with barrier dielectric material 478. Chemical mechanical polishing (CMP), or other suitable processing, may be used to remove barrier dielectric material 478 outside the etched trenches, e.g., from the portions of the dielectric material 476 and barrier dielectric material 478, on which electrode 474 is to be formed. Electrode 474 can be formed on the instances of dielectric materials 476 and barrier dielectric materials 478, oriented as shown in FIG. 4A, e.g., parallel to electrode 472 and perpendicular to the instances of dielectric materials 476 and barrier dielectric materials 478.

The barrier dielectric material 478 has a slower oxygen diffusion rate and/or is a grain-boundary disruptor with respect to the dielectric materials 476. However, as will be appreciated, the electric field between the electrodes 472 and 474 is oriented parallel to the boundaries between the dielectric materials 476 and barrier dielectric materials 478. As such, the instances of barrier dielectric materials 478 do not interrupt the formation of continuous filaments in the dielectric materials 476, as is the case for a lateral construction, e.g., FIGS. 2, 3A, and 3B, where barrier dielectric materials are formed to be perpendicular to the electric field between the electrodes, e.g., anode and cathode.

According to another example method of forming a resistive memory cell 470 in accordance with one or more embodiments of the present disclosure, electrode 472 is formed. A vertical instance of dielectric region 476 is formed, e.g., deposited, on the electrode 472 such that the dielectric region 476 is perpendicular to the electrode 472. Additional alternating instances of barrier dielectric region 478 and dielectric region 476 can be formed using sidewall deposition techniques and a contact punch, for instance. The direction of growth using sidewall deposition techniques can be as shown in FIG. 4A using vertical laminates. The barrier dielectric region 478 for this configuration of a resistive memory cell 470 is a slow oxygen diffusion barrier and/or grain-boundary disruptor material with respect to the dielectric regions 476.

Once the intended number of instances of dielectric regions 476 and barrier dielectric regions 478 are deposited and appropriately formed, CMP, or other suitable processing, may be used to remove dielectric region 476 and barrier dielectric region 478 from the build-up of dielectric region 476 and barrier dielectric region 478 on which electrode 474 is to be formed. Subsequently, electrode 474 can be formed on the instances of dielectric regions 476 and barrier dielectric regions 478, oriented as shown in FIG. 4A, e.g., parallel to electrode 472 and perpendicular to the instances of dielectric regions 476 and barrier dielectric regions 478.

Despite barrier dielectric region 478 not being located across a path for conductive filaments, vertically oriented laminates can still provide some unique switching control as the number of channels (and channel width) within which conductive filaments can form can be precisely controlled, which may be beneficial for oxygen diffusion moderation mechanisms. Controlling the number of channels (and channel width), such as by limiting the number and geometry of discrete filamentary electrical paths available, can limit radial and/or control lateral, e.g., from cathode to anode, growth of conductive filaments.

For example, vertically-oriented barrier dielectric regions 478, e.g., $Al_2O_3$, located between vertically-oriented dielectric regions 476 can maintain amorphous dielectric regions 476, e.g., $TiO_2$, as-deposited by reducing the volume of individual dielectric regions 476, particularly with respect to the horizontal thickness thereof. Thick dielectric regions 476, e.g., $TiO_2$, can crystallize as-deposited by ALD. The barrier dielectric regions 478 can provide a large decrease in as-deposited roughness. Roughness is generally unwanted as it tends to concentrate electric fields near an electrode interface, thereby degrading resistive memory cell performance due to enhanced filament formation.

According to one or more embodiments, each of the dielectric regions 476 and barrier dielectric regions 478 shown in FIG. 4A can be formed to be amorphous, such that the boundary between the dielectric regions 476 and barrier dielectric regions 478 are amorphous/amorphous boundaries. That is, resistive memory cell 470 can be fabricated to include amorphous/amorphous laminates.

After annealing, $Al_2O_3$—$TiO_2$ laminates, e.g., instances of barrier dielectric regions 478 and dielectric regions 476 respectively, can become crystalline. However, the full-width at half-maximum (FWHM) of a peak intensity for a diffraction measurement, e.g., plotted with respect to the diffraction angle, theta, is larger than for $ZrO_2$—$TiO_2$ laminates, indicating the grain size is smaller for $Al_2O_3$—$TiO_2$ laminates due to disruption.

According to one or more example embodiments of the present disclosure, a resistive memory cell can be configured to have one or multiple $SrTiO_3$—$LaAlO_3$ interfaces that can be activated/deactivated under one or more auxiliary electric fields. For example, the one or more auxiliary electric fields can be provided from field-effects at small feature size for the two-electrode system shown in FIG. 4A, for example, or can be associated with a third electrode, e.g., auxiliary electrode, positioned parallel to the vertically oriented laminates and acting as a control gate, for instance.

FIG. 4B shows a resistive memory cell 480 comprising a number of laminate dielectric regions 485 between two electrodes 482 and 484. The number of laminate dielectric regions 485 comprise alternating instances of dielectric regions 486 and barrier dielectric regions 488. As described above with respect to FIG. 4A, the instances of dielectric regions 486 and barrier dielectric regions 488 are formed using vertically-oriented laminates. That is, the instances of dielectric regions 486 and barrier dielectric regions 488 are formed substantially perpendicular to the electrode 482. Resistive memory cell 480 can be fabricated in accordance with the deposition techniques described above with respect to FIG. 4A, resulting in a lateral growth direction for the laminates.

In contrast to FIG. 4A, FIG. 4B depicts dielectric regions 486 formed to be crystalline, as may be achieved by annealing, for example. Therefore, the boundaries between the dielectric regions 486 and barrier dielectric regions 488 are crystalline/crystalline boundaries. That is, resistive memory cell 480 can be fabricated to include crystalline/crystalline vertical laminates.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of Equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a storage element for a resistive memory cell, comprising:
   forming two electrodes; and
   forming a resistive storage element, wherein the resistive storage element comprises a plurality of spaced apart dielectric regions and a plurality of barrier dielectric regions formed between the spaced apart dielectric regions, and formed between the two electrodes by:
      prior to forming a second of the two electrodes, forming a plurality of vertical instances of a dielectric material spaced apart from one another to form a plurality of vertical dielectric regions, the plurality of vertical instances of dielectric material each having an upper surface and a lower surface; and
      depositing barrier dielectric material between each of the plurality of vertical dielectric regions to form a respective plurality of barrier dielectric regions such that at least one of the plurality of dielectric material regions is formed between adjacent instances of the plurality of barrier dielectric regions, the plurality of barrier dielectric regions each having an upper surface and a lower surface,
   wherein the plurality of barrier dielectric regions and the plurality of vertical dielectric regions are substantially perpendicular to the two electrodes and are formed such that a plurality of alternating instances of the plurality of vertical dielectric regions and the plurality of barrier dielectric regions are formed between, and in contact with, the two electrodes, and wherein the entirety of the upper surface and the lower surface of each of the plurality of vertical dielectric regions and each of the plurality of barrier dielectric regions are in contact with the two electrodes.

2. The method of claim 1 wherein the plurality of dielectric regions and the plurality of barrier dielectric regions are amorphous.

3. The method of claim 1 wherein the plurality of dielectric regions and the plurality of barrier dielectric regions are crystalline.

4. The method of claim 2, wherein forming the amorphous each of the individual plurality of barrier dielectric regions includes forming the amorphous each of the individual plurality of barrier dielectric regions to a thickness of less than about 20 Angstroms.

5. The method of claim 1, wherein forming the each of the individual plurality of dielectric region includes forming the each of the individual plurality of dielectric region to a first thickness of between from about 10 to about 100 Angstroms.

6. The method of claim 1, further comprising forming the dielectric region such that a combined thickness of a first instance of the plurality of dielectric regions, a second instance of the plurality of dielectric regions, and a first instance of the plurality of barrier dielectric regions is between about 50 and about 1000 Angstroms.

7. The method of claim 1 wherein the plurality of barrier dielectric regions are a grain-boundary disruptor relative to the plurality of dielectric regions.

8. The method of claim 1, wherein each of the individual plurality of barrier dielectric region between a pair of the plurality of dielectric regions has a slower oxygen diffusion rate relative to the plurality of dielectric regions.

9. The method of claim 1, wherein forming the plurality of barrier dielectric region includes forming a material having a smaller grain size relative to a grain size of the plurality of dielectric regions, the plurality of dielectric regions being metal oxide materials.

10. The method of claim 1, wherein forming a first instance and a second instance of the plurality of vertical instances of the plurality of dielectric regions includes forming a plurality of metal oxide regions.

11. The method of claim 10, wherein forming the plurality of metal oxide regions includes forming a plurality of amorphous metal oxide region.

12. The method of claim 1, further comprising forming a buffer dielectric region wherein the buffer dielectric region has non-reactive stable electrical properties, and a lower k value and higher resistance than the first dielectric region.

13. A method of forming a memory cell, comprising:
forming a first electrode;
forming a resistive storage element, wherein the resistive storage element comprises a plurality of spaced apart dielectric regions and a plurality of barrier dielectric regions formed between the spaced apart dielectric regions and further comprising;
forming, on the first electrode, an alternating plurality of dielectric regions, wherein the plurality of dielectric regions is formed by forming a dielectric material as a plurality of vertical dielectric instances spaced apart from one another, and a plurality of barrier dielectric regions, wherein the plurality of barrier dielectric regions are formed by depositing barrier dielectric material between the plurality of vertical dielectric regions, such that each of the plurality of dielectric regions and each of the plurality of barrier dielectric regions is arranged substantially perpendicular to the first electrode, wherein each respective one of the plurality of barrier dielectric regions is formed in contact with and between a different respective pair of the plurality of dielectric regions, wherein each of the plurality of dielectric regions and barrier dielectric regions comprise an upper surface and lower surface; and
forming a second electrode on, and subsequent to forming, the plurality of dielectric regions and the plurality of barrier dielectric regions, wherein each of the plurality of dielectric regions and the plurality of barrier dielectric regions are substantially perpendicular to the first electrode and the second electrode and wherein the entirety of the upper surface and lower surface of each of the plurality of dielectric regions and each of the plurality of barrier dielectric regions are in contact with the each of the first and second electrodes.

14. The method of claim 13, wherein forming alternating dielectric region and barrier dielectric region on the first electrode includes:
forming a first dielectric region on the first electrode such that the first dielectric region is arranged to have a substantially vertical orientation perpendicular to the first electrode;
depositing a silicon dioxide barrier dielectric region between the spaced apart first dielectric region;
forming the silicon dioxide barrier dielectric region to have a substantially vertical orientation perpendicular to the first electrode;
depositing a second dielectric region on the formed silicon dioxide barrier dielectric region;
forming the second dielectric region to have a substantially vertical orientation perpendicular to the first electrode.

15. The method of claim 14, wherein forming alternating dielectric region and barrier dielectric regions on the first electrode includes:
forming dielectric material on the first electrode;
etching the dielectric material to form at least one trench substantially perpendicular to the first electrode;
depositing a silicon dioxide barrier dielectric material into the at least one trench; and
chemical-mechanical polishing (CMP) the dielectric and silicon dioxide barrier dielectric materials opposite the first electrode.

* * * * *